United States Patent
Joo et al.

(10) Patent No.: US 8,105,909 B2
(45) Date of Patent: Jan. 31, 2012

(54) METHOD OF FABRICATING NON-VOLATILE MEMORY DEVICE

(75) Inventors: Moon Sig Joo, Yongin-si (KR); Heung Jae Cho, Icheon-si (KR); Yong Soo Kim, Suwon-Si (KR); Won Joon Choi, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/894,021

(22) Filed: Sep. 29, 2010

(65) Prior Publication Data

US 2011/0014759 A1 Jan. 20, 2011

Related U.S. Application Data

(62) Division of application No. 12/345,785, filed on Dec. 30, 2008, now Pat. No. 7,824,992.

(30) Foreign Application Priority Data

Apr. 7, 2008 (KR) .................. 10-2008-0032272

(51) Int. Cl.
   *H01L 21/4763* (2006.01)
(52) U.S. Cl. ................ 438/287; 257/E21.209
(58) Field of Classification Search .......... 438/287, 438/257; 257/E21.679, E21.209, E21.662
   See application file for complete search history.

(56) References Cited

U.S. PATENT DOCUMENTS

| 6,617,639 | B1* | 9/2003 | Wang et al. ............... 257/324 |
| 7,390,756 | B2* | 6/2008 | Ahn et al. ................. 438/785 |
| 2007/0187831 | A1 | 8/2007 | Ahn et al. |
| 2008/0124907 | A1* | 5/2008 | Forbes et al. ............. 438/587 |
| 2009/0134453 | A1* | 5/2009 | Govoreanu et al. ....... 257/326 |

FOREIGN PATENT DOCUMENTS

| JP | 2006-245322 A | 9/2006 |
| KR | 10-2008-0005064 | 1/2008 |
| KR | 10-2008-0006270 | 1/2008 |
| KR | 10-2008-0070561 | 7/2008 |

\* cited by examiner

*Primary Examiner* — Thao P. Le
(74) *Attorney, Agent, or Firm* — Marshall, Gerstein & Borun LLP

(57) ABSTRACT

A method of fabricating a non-volatile memory device includes: forming a tunnel insulation layer pattern and a floating gate electrode layer pattern over a semiconductor substrate; forming an isolation trench by etching an exposed portion of the semiconductor substrate so that the isolation trench is aligned with the tunnel insulation layer pattern and the floating gate electrode layer pattern; forming an isolation layer by filling the isolation trench with a filling insulation layer; forming a hafnium-rich hafnium silicon oxide layer over the isolation layer and the floating gate electrode layer pattern; forming a hafnium-rich hafnium silicon oxynitride layer by carrying out a first nitridation on the hafnium-rich hafnium silicon oxide layer; forming a silicon-rich hafnium silicon oxide layer over the hafnium-rich hafnium silicon oxynitride layer; forming a silicon-rich hafnium silicon oxynitride layer by carrying out a second nitridation on the silicon-rich hafnium silicon oxide layer; and forming a control gate electrode layer over the silicon-rich hafnium silicon oxynitride layer.

16 Claims, 8 Drawing Sheets

METHOD OF FABRICATING NON-VOLATILE MEMORY DEVICE

CROSS-REFERENCE TO RELATED APPLICATIONS

This is a division of U.S. application Ser. No. 12/345,785 filed Dec. 30, 2008, which claims the priority benefit under USC 119 of KR 10-2008-0032272 filed Apr. 7, 2008, the entire respective disclosures of which are incorporated herein by reference.

The present invention relates to a method of fabricating a non-volatile memory device, and more particularly, to a method of fabricating a non-volatile memory device which employs a high-k dielectric layer as an intergate insulation layer.

Memory devices used to store data may be classified into a volatile memory device and a non-volatile memory device depending on ability whether it can maintain the data even when power supply is cut off. While the volatile memory device loses the stored data when the power supply is cut off, the non-volatile memory device maintains the stored data even when the power supply is cut off. Therefore, the non-volatile memory device is widely used where the power supply is always unavailable or interrupted sometimes or use of lower power is required such as a mobile telephone system, a memory card for storing music/movie data and other application devices.

FIG. 1 is a cross-sectional view illustrating a conventional non-volatile memory device having a floating gate stack structure. Referring to FIG. 1, on a semiconductor substrate 100 having an active region 104 defined by an isolation layer 102 is disposed a tunnel insulation layer pattern 110, on which a plurality of floating gate electrode layer patterns 120 are disposed apart from each other. An intergate insulation layer 130 is disposed over the exposed surface of the isolation layer 102 and the floating gate electrode layer patterns. A control gate electrode layer 140 is disposed over the intergate insulation layer 130. The tunnel insulation layer 110 is made of an oxide layer and the intergate insulation layer 130 is made of an oxide layer/nitride layer/oxide layer (ONO) structure. Also, the floating gate electrode layer pattern 120 and the control gate electrode 140 are made of a polysilicon layer.

However, as an integration degree of the non-volatile memory device is increased, a distance between the floating gate electrode layer patterns 120 is more and more decreased. Accordingly, a space between the floating gate electrode layer patterns 120 in which the control gate electrode layer 140 is inserted becomes insufficient and generation of an interference between the floating gate electrode layer patterns 120 by a parasitic capacitance 150 is getting serious. Therefore, in order to restrict the problem, there have been recently tried efforts of reducing a thickness of the intergate insulation layer 130 together with employment of a planar structure in which the intergate insulation layer 130 is excluded from side faces of the floating gate electrode layer patterns 120. However, it is known that it is not easy to reduce the thickness of an effective oxide layer to below a certain thickness with the currently used intergate insulation layer 130 with the ONO structure. For example, in order to maintain a coupling ratio above 0.5 while employing the planar structure, the thickness of the effective oxide layer should be maintained below 80 Å. However, it is hard to actually apply the intergate insulation layer 130 of the ONO structure having the thickness of the effective oxide layer of below 80 Å since leakage current is rapidly increased.

Accordingly, there has been studied a method of forming the intergate insulation layer 130 using a high-k dielectric layer having a high dielectric constant instead of the ONO structure. However, the use of the high-k dielectric layer as the intergate insulation layer 130 may cause the following problems. First, upon deposition of the high-k dielectric layer or subsequent thermal process, the high-k dielectric layer and the floating gate electrode layer pattern 120 are react to form a silicon oxide ($SiO_2$) layer. This silicon oxide layer may rather increase the thickness of the effective oxide layer of the intergate insulation layer 130. Second, crystallization of the high-k dielectric layer itself by the subsequent thermal process occurs and this may deteriorate the leakage current properties. Third, phase separation of the high-k dielectric layer by the subsequent thermal process occurs and impurities are diffused into the high-k dielectric layer upon formation of the control gate layer electrode 140, which may lead to deterioration of the leakage current properties.

SUMMARY OF THE INVENTION

Embodiments of the present invention are directed to a method of fabricating a non-volatile memory device which is able to prevent deterioration of leakage current due to a subsequent process while forming an intergate insulation layer with a high-k dielectric layer having a sufficiently thin thickness of an effective oxide layer.

In one embodiment, a method of fabricating a non-volatile memory device includes: forming a tunnel insulation layer pattern and a floating gate electrode layer pattern over a semiconductor substrate; forming an isolation trench by etching an exposed portion of the semiconductor substrate so that the isolation trench is aligned with the tunnel insulation layer pattern and the floating gate electrode layer pattern; forming an isolation layer by filling the isolation trench with a filling insulation layer; forming a hafnium-rich hafnium silicon oxide layer over the isolation layer and the floating gate electrode layer pattern; forming a hafnium-rich hafnium silicon oxynitride layer by carrying out a first nitridation on the hafnium-rich hafnium silicon oxide layer; forming a silicon-rich hafnium silicon oxide layer over the hafnium-rich hafnium silicon oxynitride layer; forming a silicon-rich hafnium silicon oxynitride layer by carrying out a second nitridation on the silicon-rich hafnium silicon oxide layer; and forming a control gate electrode layer over the silicon-rich hafnium silicon oxynitride layer.

The method may further include, before forming the hafnium-rich hafnium silicon oxide layer, carrying pre-cleaning for removing a native oxide layer over the floating gate electrode layer pattern.

The hafnium-rich hafnium silicon oxide layer is formed to a thickness below 80 Å.

The first nitridation is carried out so that a rate of nitrogen atom coupled in the hafnium-rich hafnium silicon oxide layer is 5 to 40%.

The first nitridation is carried out by a plasma nitridation, by a rapid thermal process in a $N_2$ atmosphere or a $NH_3$ atmosphere, or by supplying a $N_2$ gas or a $NH_3$ gas into a furnace.

The silicon-rich hafnium silicon oxide layer is formed to a thickness below 80 Å.

The second nitridation is carried out so that a rate of nitrogen atom coupled in the silicon-rich hafnium silicon oxide layer is 5 to 40%.

The second nitridation is carried out by a plasma nitridation, by a rapid thermal process in a $N_2$ atmosphere or a $NH_3$ atmosphere, or by supplying a $N_2$ gas or a $NH_3$ gas into a furnace.

In another embodiment, a method of fabricating a non-volatile memory device includes: forming a tunnel insulation layer pattern and a floating gate electrode layer pattern over a semiconductor substrate; forming an isolation trench by etching an exposed portion of the semiconductor substrate so that the isolation trench is aligned with the tunnel insulation layer pattern and the floating gate electrode layer pattern; forming an isolation layer by filling the isolation trench with a filling insulation layer; forming a first hafnium-rich hafnium silicon oxide layer over the isolation layer and the floating gate electrode layer pattern; forming a first hafnium-rich hafnium silicon oxynitride layer by carrying out a first nitridation on the first hafnium-rich hafnium silicon oxide layer; forming a silicon-rich hafnium silicon oxide layer over the first hafnium-rich hafnium silicon oxynitride layer; forming a silicon-rich hafnium silicon oxynitride layer by carrying out a second nitridation on the silicon-rich hafnium silicon oxide layer; forming a second hafnium-rich hafnium silicon oxide layer over the silicon-rich hafnium silicon oxynitride layer; forming a second hafnium-rich hafnium silicon oxynitride layer by carrying out a third nitridation on the second hafnium-rich hafnium silicon oxide layer; and forming a control gate electrode layer over the second hafnium-rich hafnium silicon oxynitride layer.

In further another embodiment, a method of fabricating a non-volatile memory device includes: forming a tunnel insulation layer pattern and a floating gate electrode layer pattern over a semiconductor substrate; forming an isolation trench by etching an exposed portion of the semiconductor substrate so that the isolation trench is aligned with the tunnel insulation layer pattern and the floating gate electrode layer pattern; forming an isolation layer by filling the isolation trench with a filling insulation layer; forming a zirconium-rich zirconium silicon oxide layer over the isolation layer and the floating gate electrode layer pattern; forming a zirconium-rich hafnium silicon oxynitride layer by carrying out a first nitridation on the zirconium-rich hafnium silicon oxide layer; forming a silicon-rich zirconium silicon oxide layer over the zirconium-rich zirconium silicon oxynitride layer; forming a silicon-rich zirconium silicon oxynitride layer by carrying out a second nitridation on the silicon-rich zirconium silicon oxide layer; and forming a control gate electrode layer over the silicon-rich zirconium silicon oxynitride layer.

In further another embodiment, a method of fabricating a non-volatile memory device includes: forming a tunnel insulation layer pattern and a floating gate electrode layer pattern over a semiconductor substrate; forming an isolation trench by etching an exposed portion of the semiconductor substrate so that the isolation trench is aligned with the tunnel insulation layer pattern and the floating gate electrode layer pattern; forming an isolation layer by filling the isolation trench with a filling insulation layer; forming a first zirconium-rich zirconium silicon oxide layer over the isolation layer and the floating gate electrode layer pattern; forming a first zirconium-rich zirconium silicon oxynitride layer by carrying out a first nitridation on the first zirconium-rich zirconium silicon oxide layer; forming a silicon-rich zirconium silicon oxide layer over the first zirconium-rich zirconium silicon oxynitride layer; forming a silicon-rich zirconium silicon oxynitride layer by carrying out a second nitridation on the silicon-rich zirconium silicon oxide layer; forming a second zirconium-rich zirconium silicon oxide layer over the silicon-rich zirconium silicon oxynitride layer; forming a second zirconium-rich zirconium silicon oxynitride layer by carrying out a third nitridation on the second zirconium-rich zirconium silicon oxide layer; and forming a control gate electrode layer over the second zirconium-rich zirconium silicon oxynitride layer.

In accordance with the present invention, it is possible to prevent deterioration of leakage current due to a subsequent process while forming an intergate insulation layer with a high-k dielectric layer having a sufficiently thin thickness of an effective oxide layer.

DESCRIPTION OF SPECIFIC EMBODIMENTS

Hereinafter, preferred embodiments of the present invention will be described with reference to accompanying drawings. The embodiments are for illustrative purposes only, and the scope of the present invention is not limited thereto.

Figure 1:
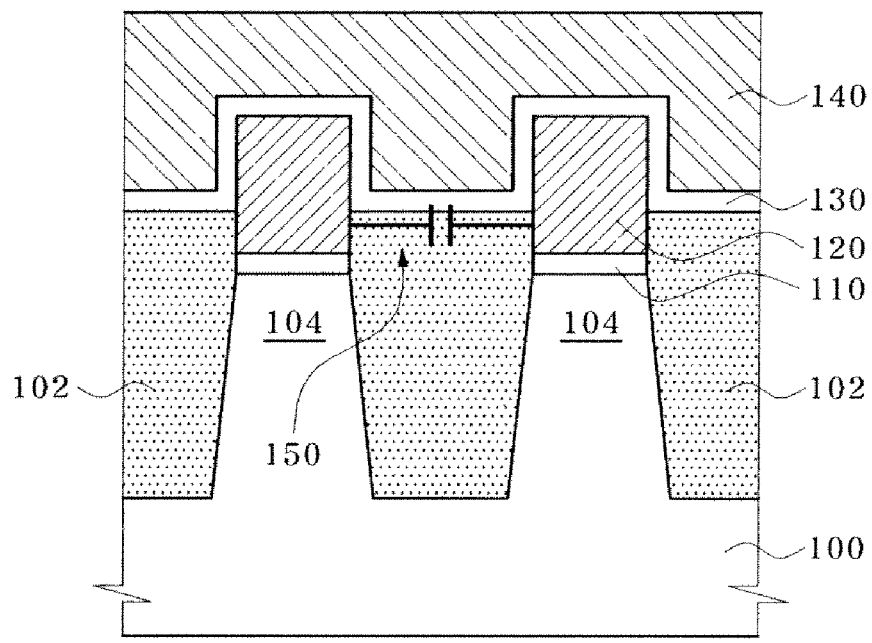
FIG. 1 is a cross-sectional view illustrating a conventional non-volatile memory device having a floating gate stack structure.
Figure 2:
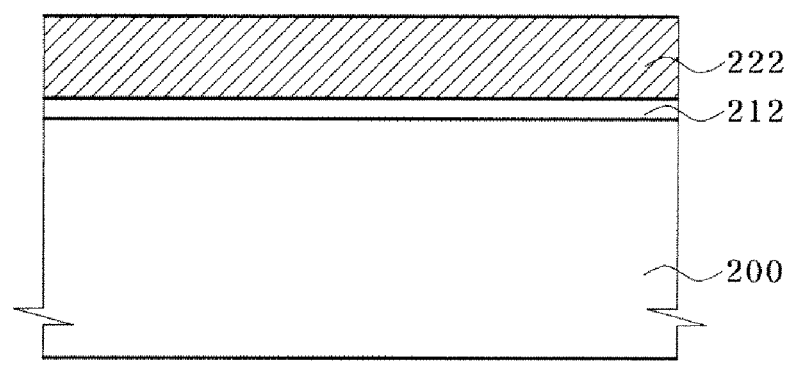
FIGS. 2 to 7 are cross-sectional views illustrating a method of fabricating a non-volatile memory device in accordance with an embodiment of the present invention.

FIGS. 2 to 7 are cross-sectional views illustrating a method of fabricating a non-volatile memory device in accordance with an embodiment of the present invention. Referring first to FIG. 2, a tunnel insulation layer 212 is formed over a semiconductor substrate 200. The tunnel insulation layer 212 may be formed of an oxide layer. Next, a floating gate electrode layer 222 is formed over the tunnel insulation layer 212. The floating gate electrode layer 222 may be formed of a polysilicon layer but not limited thereto. When the floating gate electrode layer 222 is formed of a polysilicon layer, the polysilicon layer may have been doped with phosphorous at a doping concentration of about $5 \times 10^{19}$ to $3 \times 10^{20}/cm^3$.

Figure 3:
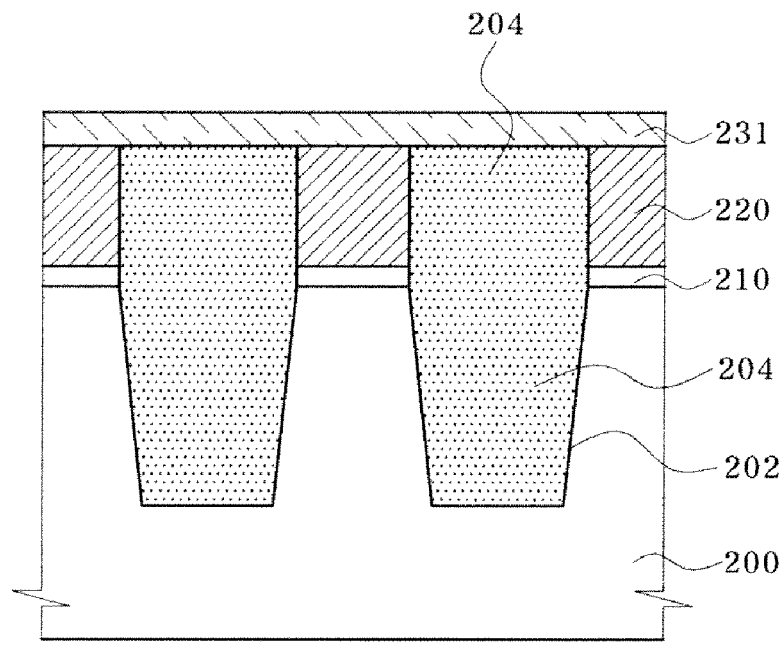

Referring next to FIG. 3, patterning on the floating gate electrode layer (222 in FIG. 2) and the tunnel insulation layer (212 in FIG. 2) is carried out using a predetermined mask layer pattern (not shown). Then, a tunnel insulation layer pattern 210 and a floating gate electrode layer pattern 220 which expose an isolation region of the semiconductor substrate 200 are formed. Subsequently, the exposed portion of the semiconductor substrate 200 is etched to form an isolation trench 202 aligned with the tunnel insulation layer pattern 210 and the floating gate electrode layer pattern 220. And, an inside of the isolation trench 202 is filled with a filling insulation layer to form a trench isolation layer 204.

Next, a hafnium (Hf)-rich hafnium silicon oxide (HfSiO) layer 231 is formed over the trench isolation layer 204 and the floating gate electrode layer pattern 220. The Hf-rich HfSiO layer 231 means the case that an atomic ratio of Hf to silicon (Si) is greater than 1:1. In a case of a silicon-rich HfSiO layer in which the atomic ratio of hafnium to silicon is smaller than 1:1, an oxygen atom present in the HfSiO layer react with a silicon atom present in the below floating gate electrode layer pattern 220 upon deposition of the HfSiO layer to form a $SiO_2$ layer having a relatively small dielectric constant, thereby increasing a thickness of an effective oxide layer. On the contrary, in the case of the silicon-rich HfSiO layer, the oxygen atom is strongly bonded to a hafnium atom having an electronegativity lower than that of the silicon, thereby lowering formation of the silicon oxide layer. The Hf-rich HfSiO layer 231 is formed to a thickness below about 80 Å using Atomic Layer Deposition (ALD) or Metal Organic Chemical Vapor Deposition (MOCVD). In an example, before the Hf-rich HfSiO layer 231 is formed, a pre-cleaning may be carried out to for remove a native oxide layer which may be present on a surface of the floating gate electrode layer pattern 220.

Figure 4:
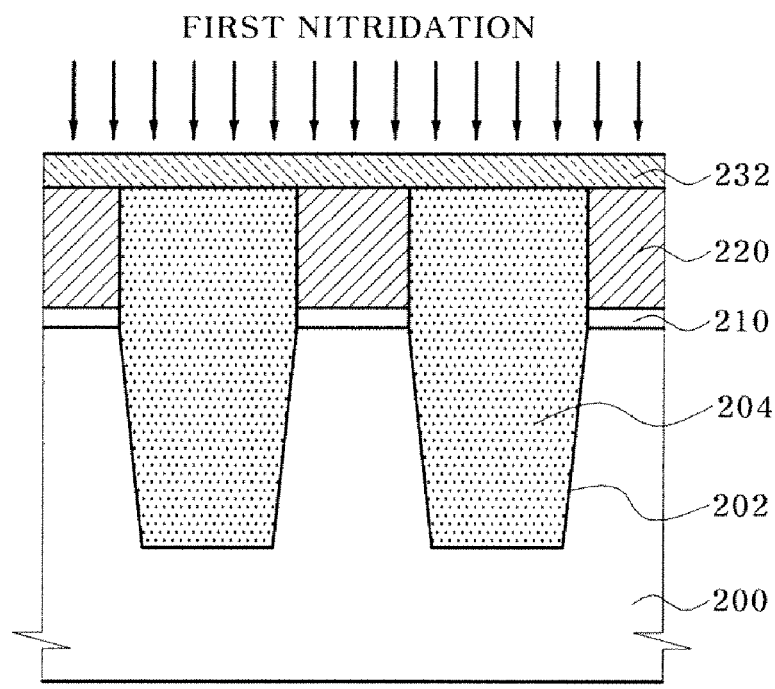

Referring next to FIG. 4, as indicated by arrows, a first nitridation on the Hf-rich HFSiO layer (231 in FIG. 3) is carried out to form a Hf-rich hafnium silicon oxynitride (Hf-SiON) layer 232. This is for preventing that an oxide layer is additionally formed and crystallized by a subsequent thermal process. In an example, the first nitridation is carried out using a plasma nitridation. In another example, the first nitridation is carried out using a Raid Thermal Process (RTP) in a $N_2$ atmosphere or $NH_3$ atmosphere. In this case, a temperature is set to about 700 to 1000° C. In further another example, the first nitridation is carried out by supplying $N_2$ gas or $NH_3$ gas into a furnace. In this case, a temperature is set to about 700 to 900° C. In any example, the rate of nitrogen atom coupled in the Hf-rich HfSiO layer (231 in FIG. 3) is about 5 to 40%.

Figure 5:
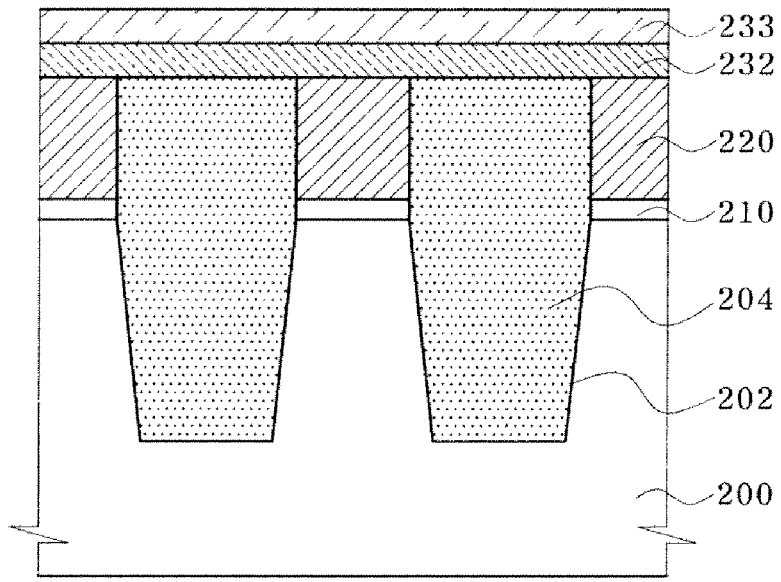

Referring next to FIG. 5, a Si-rich HFSiO layer 233 is formed over the Hf-rich HfSiON layer 232. The Si-rich HFSiO layer 233 means that the atomic ratio of hafnium to silicon is smaller than 1:1. Although it is possible to inhibit the crystallization by the subsequent thermal process to a certain extent as the Hf-rich HfSiON layer 232 is formed by carrying out the first nitridation on the Hf-rich HfSiO layer 231, there is still possibility of the crystallization by the subsequent thermal process. Since the Si-rich HfSiO layer 233 has relatively high crystallization temperature, it is remained in an amorphous state after deposition and thus can sufficiently inhibit the crystallization of entire intergate insulation layer. The Si-rich HfSiO layer 233 is formed to a thickness below 80 Å using ALD or MOCVD.

Figure 6:
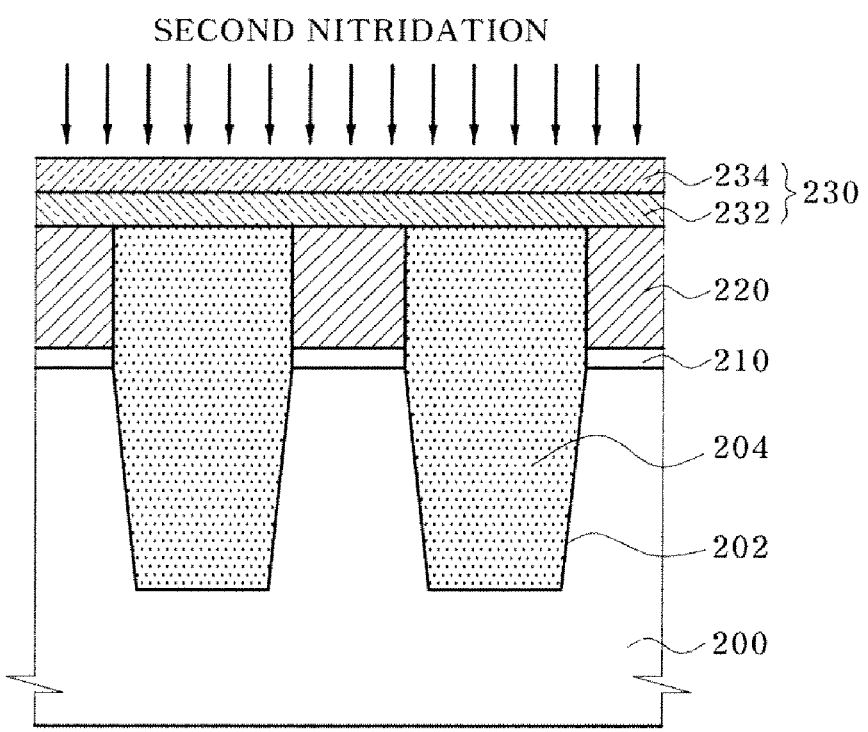

Referring next to FIG. 6, as indicated by arrows, a second nitridation on the Si-rich HfSiO layer (233 in FIG. 5) is carried out to form a Si-rich HfSiON layer 234. The Si-rich HfSiO layer (233 in FIG. 5) may be subject to phase separation by a subsequent thermal process and thus separated into a hafnium oxide ($HfO_2$) layer and a silicon oxide ($SiO_2$) layer or may react with a control gate electrode layer to be formed thereon. Also, upon subsequent deposition of the control gate electrode layer, impurities may be diffused into the Si-rich HfSiO layer (233 in FIG. 5). These problems can be prevented by forming the Si-rich HfSiON layer 234 by the second nitridation. In an example, the second nitridation is carried out using a plasma nitridation. In another example, the second nitridation is carried out using a RTP in a $N_2$ atmosphere or $NH_3$ atmosphere. In this case, a temperature is set to about 700 to 1000° C. In further another example, the second nitridation is carried out by supplying $N_2$ gas or $NH_3$ gas into a furnace. In this case, a temperature is set to about 700 to 900° C. In any example, the rate of nitrogen atom coupled in the Si-rich HfSiO layer (233 in FIG. 5) is about 5 to 40%. The Si-rich HfSiON layer 234 forms an intergate insulation layer 230 together with the Hf-rich HfSiON layer 232.

Figure 7:
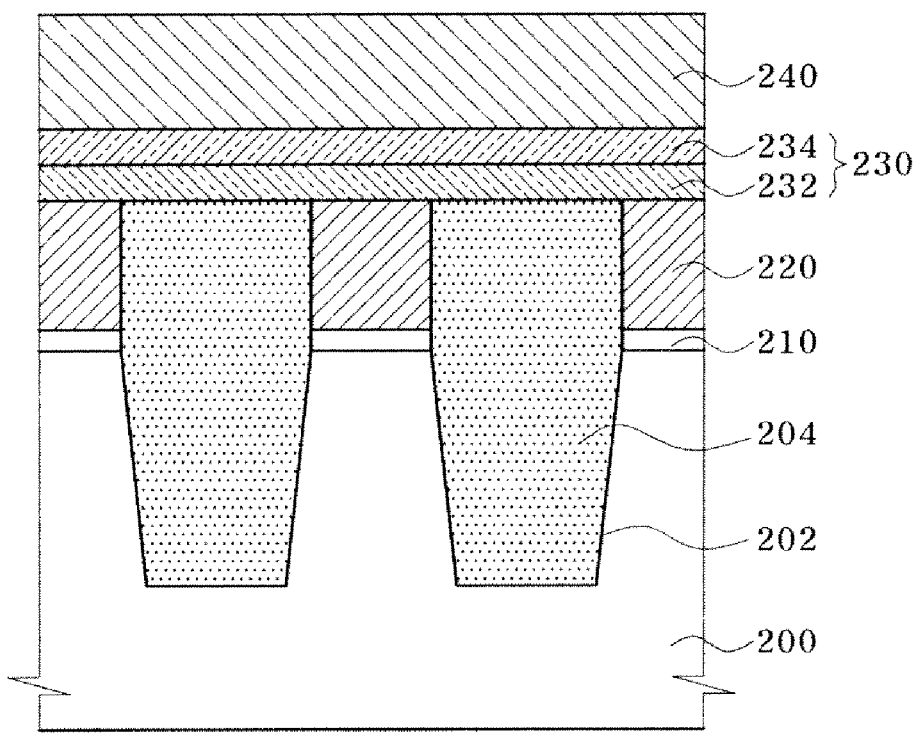

Referring next to FIG. 7, the control gate electrode layer 240 is formed over the intergate insulation layer 230 formed by stacking the Hf-rich HfSiON layer 232 and the Si-rich HfSiON layer 234 in turn. In an example, the control gate electrode layer 240 may be formed of a polysilicon layer. In another example, the control gate electrode layer 240 may be formed of a Metal Inserted PolySilicon (MIPS) layer.

FIGS. 8 to 15 are cross-sectional views illustrating a method of fabricating a non-volatile memory device in accordance with another embodiment of the present invention.

Figure 8:
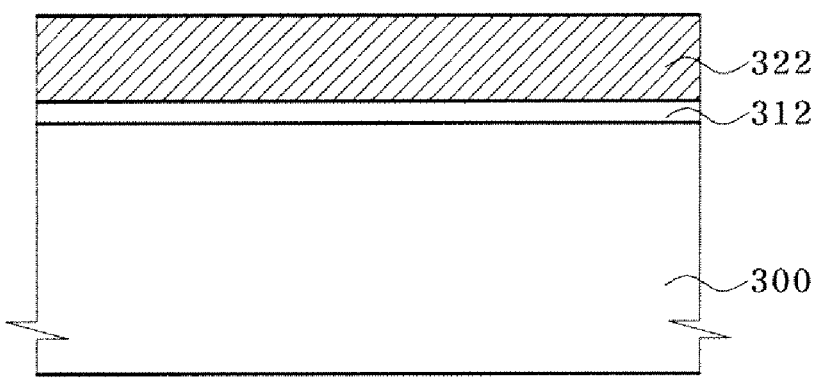
FIGS. 8 to 15 are cross-sectional views illustrating a method of fabricating a non-volatile memory device in accordance with another embodiment of the present invention.

Referring first to FIG. 8, a tunnel insulation layer 312 is formed over a semiconductor substrate 300. The tunnel insulation layer 312 may be formed of an oxide layer. Next, a floating gate electrode layer 322 is formed over the tunnel insulation layer 312. The floating gate electrode layer 322 may be formed of a polysilicon layer but not limited thereto. When the floating gate electrode layer 322 is formed of a polysilicon layer, the polysilicon layer may have been doped with phosphorous at a doping concentration of about $5\times10^{19}$ to $3\times10^{20}/cm^3$.

Figure 9:
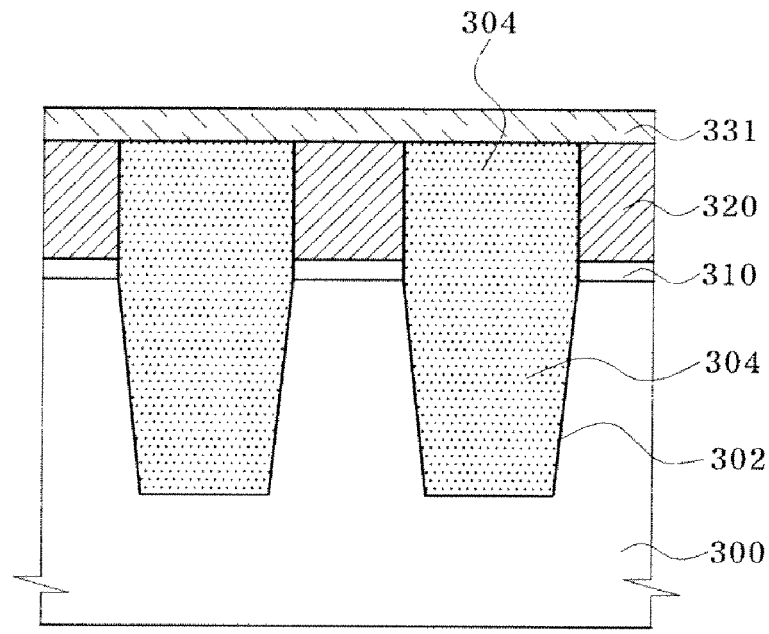

Referring next to FIG. 9, patterning on the floating gate electrode layer (322 in FIG. 8) and the tunnel insulation layer (312 in FIG. 8) is carried out using a predetermined mask layer pattern (not shown). Then, a tunnel insulation layer pattern 310 and a floating gate electrode layer pattern 320 which expose an isolation region of the semiconductor substrate 300 are formed. Subsequently, the exposed portion of the semiconductor substrate 300 is etched to form an isolation trench 302 aligned with the tunnel insulation layer pattern 310 and the floating gate electrode layer pattern 320. And, an inside of the isolation trench 302 is filled with a filling insulation layer to form a trench isolation layer 304.

Next, a first Hf-rich HfSiO layer 331 is formed over the trench isolation layer 304 and the floating gate electrode layer pattern 320. The first Hf-rich HfSiO layer 331 means the case that an atomic ratio of Hf to Si is greater than 1:1. The first Hf-rich HfSiO layer 331 is formed to a thickness of about 30 to 130 Å using ALD or MOCVD. In an example, before the first Hf-rich HfSiO layer 331 is formed, a pre-cleaning may be carried out to for remove a native oxide layer which may be present on a surface of the floating gate electrode layer pattern 320.

Figure 10:
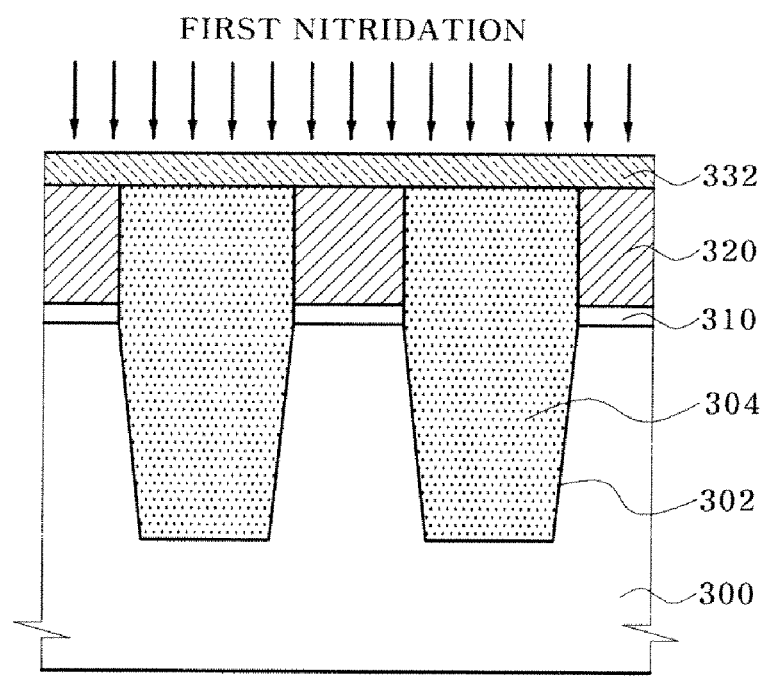

Referring next to FIG. 10, as indicated by arrows, a first nitridation on the first Hf-rich HFSiO layer (331 in FIG. 9) is carried out to form a first Hf-rich HfSiON layer 332. In an example, the first nitridation is carried out using a plasma nitridation. In another example, the first nitridation is carried out using a RTP in a $N_2$ atmosphere or $NH_3$ atmosphere. In this case, a temperature is set to about 700 to 1000° C. In further another example, the first nitridation is carried out by supplying $N_2$ gas or $NH_3$ gas into a furnace. In this case, a temperature is set to about 700 to 900° C. In any example, the rate of nitrogen atom coupled in the Hf-rich HfSiO layer (331 in FIG. 9) is about 5 to 40%.

Figure 11:
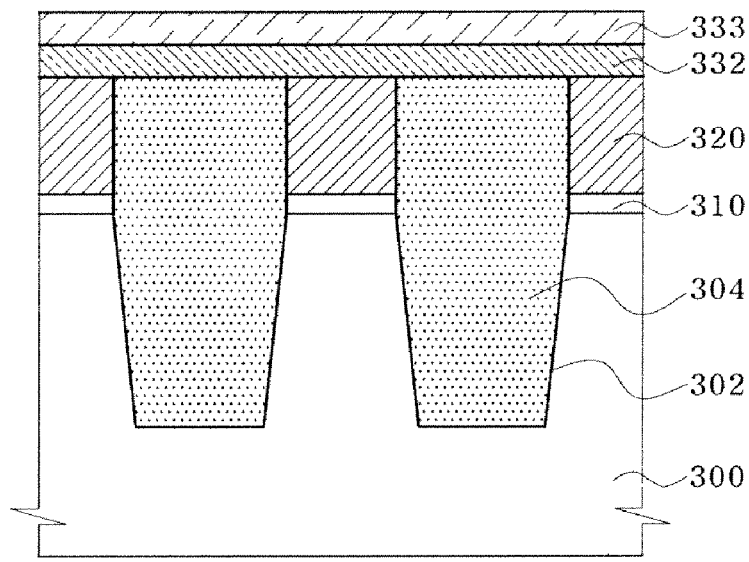

Referring next to FIG. 11, a Si-rich HFSiO layer 333 is formed over the first Hf-rich HfSiON layer 332. The Si-rich HFSiO layer 333 means that the atomic ratio of hafnium to silicon is smaller than 1:1. The Si-rich HfSiO layer 333 is formed to a thickness of about 30 to 130 Å using ALD or MOCVD.

Figure 12:
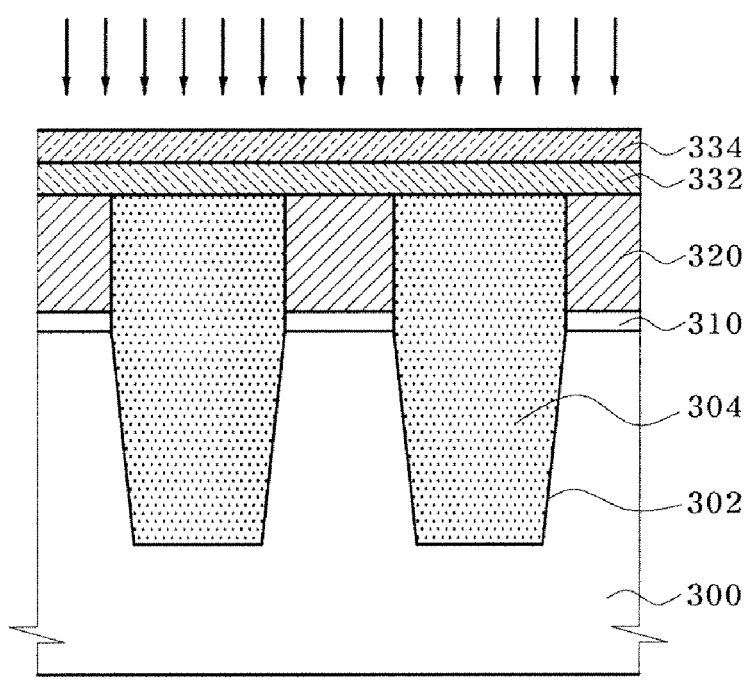

Referring next to FIG. 12, as indicated by arrows, a second nitridation on the Si-rich HfSiO layer (333 in FIG. 11) is carried out to form a Si-rich HfSiON layer 334. In an example, the second nitridation is carried out using a plasma nitridation. In another example, the second nitridation is carried out using a RTP in a $N_2$ atmosphere or $NH_3$ atmosphere. In this case, a temperature is set to about 700 to 1000° C. In further another example, the second nitridation is carried out by supplying $N_2$ gas or $NH_3$ gas into a furnace. In this case, a temperature is set to about 700 to 900° C. In any example, the rate of nitrogen atom coupled in the Si-rich HfSiO layer (333 in FIG. 11) is about 5 to 40%.

Figure 13:
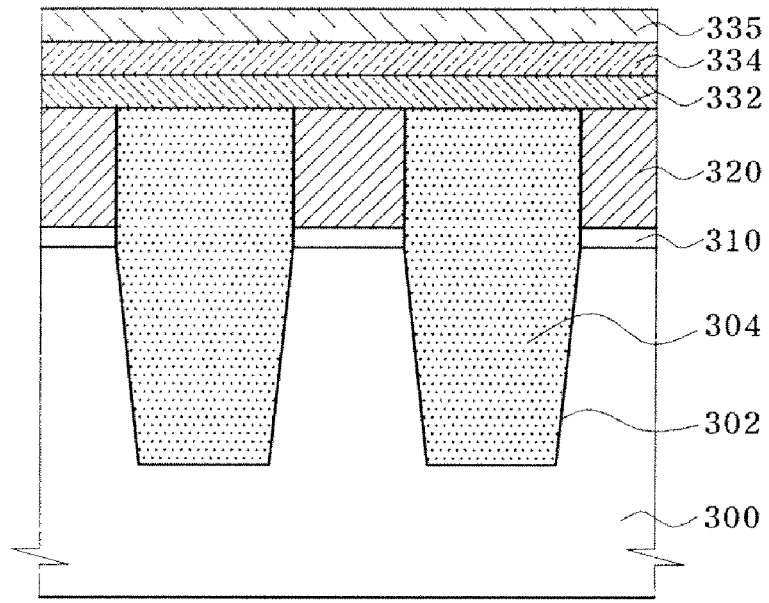

Referring next to FIG. 13, a second Hf-rich HfSiO layer 335 is formed over the Si-rich HfSiON layer 334. The second Hf-rich HfSiO layer 335 means the case that an atomic ratio of Hf to Si is greater than 1:1. The second Hf-rich HfSiO layer 335 is formed to a thickness of about 30 to 130 Å using ALD or MOCVD.

Figure 14:
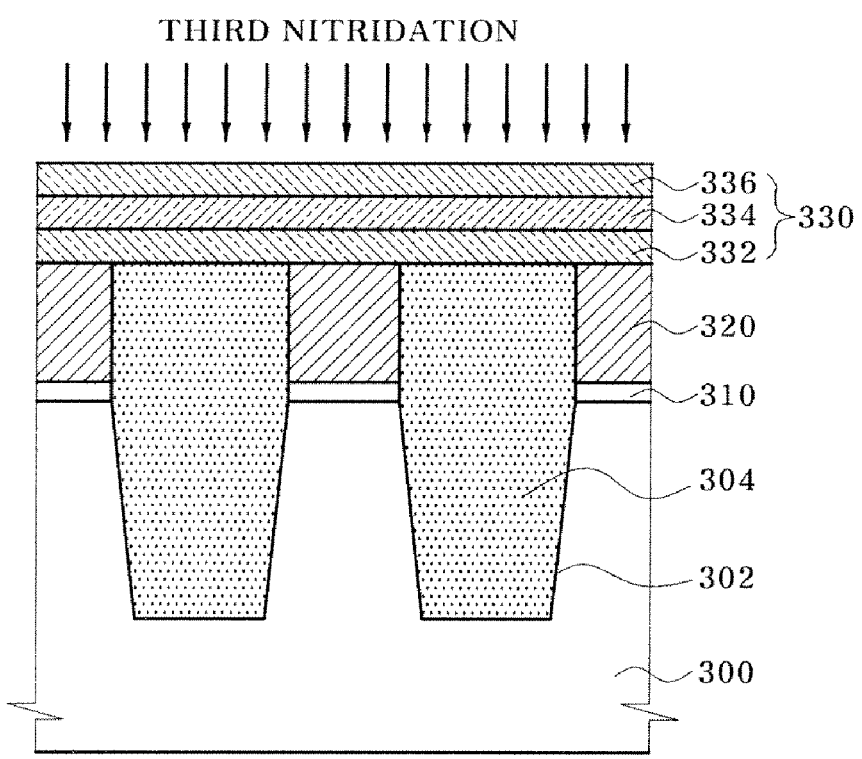

Referring next to FIG. 14, as indicated by arrows, a third nitridation on the second Hf-rich HFSiO layer (335 in FIG. 13) is carried out to form a second Hf-rich HfSiON layer 336. In an example, the third nitridation is carried out using a plasma nitridation. In another example, the third nitridation is carried out using a RTP in a $N_2$ atmosphere or $NH_3$ atmosphere. In this case, a temperature is set to about 700 to 1000° C. In further another example, the third nitridation is carried out by supplying $N_2$ gas or $NH_3$ gas into a furnace. In this case, a temperature is set to about 700 to 900° C. In any example, the rate of nitrogen atom coupled in the Hf-rich HfSiO layer (335 in FIG. 13) is about 5 to 40%. The second Hf-rich HfSiON layer 336 forms an intergate insulation layer 330 together with the Si-rich HfSiON layer 334 and the first Hf-rich HfSiON layer 332.

Figure 15:
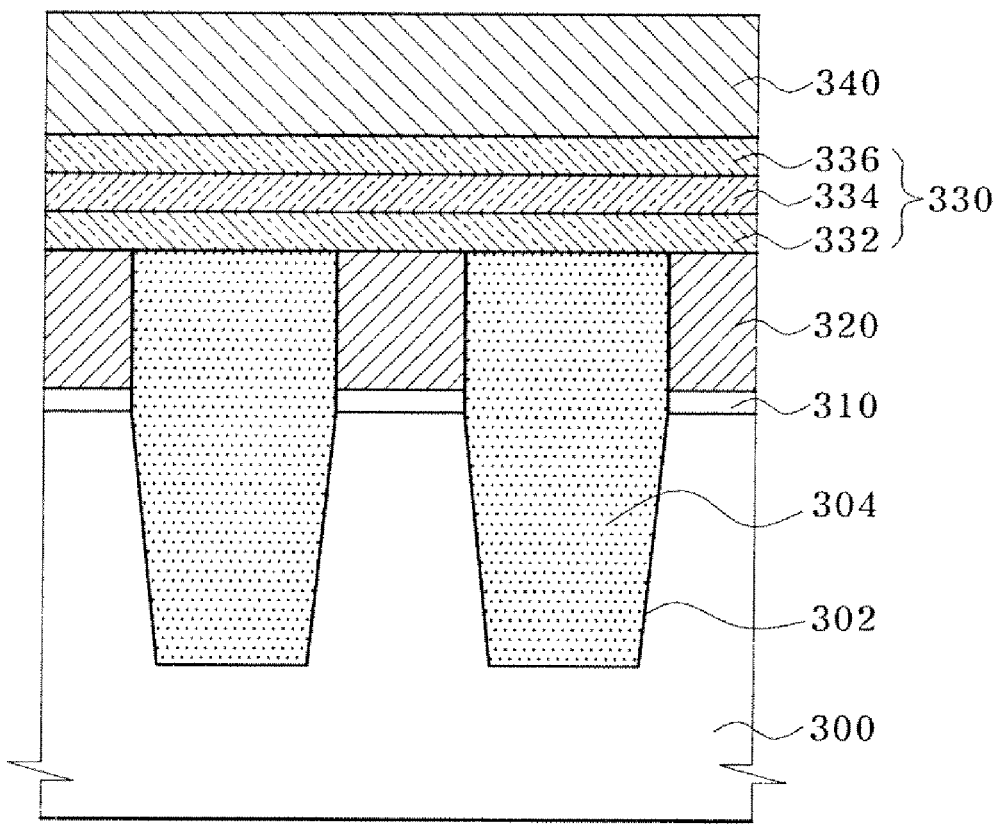

Referring next to FIG. 15, the control gate electrode layer 340 is formed over the intergate insulation layer 330 formed by stacking the first Hf-rich HfSiON layer 332, the Si-rich HfSiON layer 334 and the second Hf-rich HfSiON layer 336 in turn. In an example, the control gate electrode layer 340 may be formed of a polysilicon layer. In another example, the control gate electrode layer 340 may be formed of a MIPS layer.

In accordance with further another embodiment, in FIGS. 2 to 7, Zirconium (Zr)-rich zirconium silicon oxide (ZrSiO) layer and Si-rich ZrSiO layer may be used instead of the Hf-rich HfSiO layer 231 and the Si-rich HfSiO layer 233, respectively. In this case, the Zr-rich ZrSiO layer becomes a Zr-rich zirconium silicon oxynitride (ZrSiON) layer by the first nitridation and the Si-rich ZrSiO layer becomes a Si-rich ZrSiON layer by the second nitridation.

In accordance with further another embodiment, in FIGS. 8 to 15, a first Zr-rich ZrSiO layer, a Si-rich ZrSiO layer and a second Zr-rich ZrSiO layer may be used instead of the first Hf-rich HfSiO layer 331, the Si-rich HfSiO layer 333 and the second Hf-rich HfSiO layer 335, respectively. In this case, the first Zr-rich ZrSiO layer becomes a first Zr-rich ZrSiON layer by the first nitridation, the Si-rich ZrSiO layer becomes a Si-rich ZrSiON layer by the second nitridation and the second Zr-rich ZrSiO layer becomes a second Zr-rich ZrSiON layer by the third nitridation.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a non-volatile memory device, comprising:
   forming a tunnel insulation layer pattern and a floating gate electrode layer pattern over a semiconductor substrate;
   forming an isolation trench by etching an exposed portion of the semiconductor substrate so that the isolation trench is aligned with the tunnel insulation layer pattern and the floating gate electrode layer pattern;
   forming an isolation layer by filling the isolation trench with a filling insulation layer;
   forming a zirconium-rich zirconium silicon oxide layer over the isolation layer and the floating gate electrode layer pattern;
   forming a zirconium-rich hafnium silicon oxynitride layer by carrying out a first nitridation on the zirconium-rich hafnium silicon oxide layer;
   forming a silicon-rich zirconium silicon oxide layer over the zirconium-rich zirconium silicon oxynitride layer;
   forming a silicon-rich zirconium silicon oxynitride layer by carrying out a second nitridation on the silicon-rich zirconium silicon oxide layer; and
   forming a control gate electrode layer over the silicon-rich zirconium silicon oxynitride layer.

2. The method of claim 1, further comprising, before forming the zirconium-rich zirconium silicon oxide layer, carrying out pre-cleaning to remove a native oxide layer over the floating gate electrode layer pattern.

3. The method of claim 1, wherein the zirconium-rich zirconium silicon oxide layer is formed to a thickness below 80 Å.

4. The method of claim 1, wherein the first nitridation is carried out so that a rate of nitrogen atom coupled in the zirconium-rich zirconium silicon oxide layer is 5% to 40%.

5. The method of claim 1, wherein the first nitridation is carried out by plasma nitridation, by a rapid thermal process in an $N_2$ atmosphere, or an $NH_3$ atmosphere, or by supplying an $N_2$ gas or a $NH_3$ gas into a furnace.

6. The method of claim 1, wherein the silicon-rich zirconium silicon oxide layer is formed to a thickness below 80 Å.

7. The method of claim 1, wherein the second nitridation is carried out so that a rate of nitrogen atom coupled in the silicon-rich zirconium silicon oxide layer is 5% to 40%.

8. The method of claim 1, wherein the second nitridation is carried out by plasma nitridation, by a rapid thermal process in an $N_2$ atmosphere, or a $NH_3$ atmosphere, or by supplying an $N_2$ gas or an $NH_3$ gas into a furnace.

9. A method of fabricating a non-volatile memory device, comprising:
   forming a tunnel insulation layer pattern and a floating gate electrode layer pattern over a semiconductor substrate;
   forming an isolation trench by etching an exposed portion of the semiconductor substrate so that the isolation trench is aligned with the tunnel insulation layer pattern and the floating gate electrode layer pattern;
   forming an isolation layer by filling the isolation trench with a filling insulation layer;
   forming a first zirconium-rich zirconium silicon oxide layer over the isolation layer and the floating gate electrode layer pattern;
   forming a first zirconium-rich zirconium silicon oxynitride layer by carrying out a first nitridation on the first zirconium-rich zirconium silicon oxide layer;
   forming a silicon-rich zirconium silicon oxide layer over the first zirconium-rich zirconium silicon oxynitride layer;
   forming a silicon-rich zirconium silicon oxynitride layer by carrying out a second nitridation on the silicon-rich zirconium silicon oxide layer;
   forming a second zirconium-rich zirconium silicon oxide layer over the silicon-rich zirconium silicon oxynitride layer;
   forming a second zirconium-rich zirconium silicon oxynitride layer by carrying out a third nitridation on the second zirconium-rich zirconium silicon oxide layer; and
   forming a control gate electrode layer over the second zirconium-rich zirconium silicon oxynitride layer.

10. The method of claim 9, further comprising, before forming the first zirconium-rich zirconium silicon oxide layer, carrying pre-cleaning for removing a native oxide layer over the floating gate electrode layer pattern.

11. The method of claim 9, wherein the first zirconium-rich zirconium silicon oxide layer is formed to a thickness below 80 Å.

12. The method of claim 9, wherein the first nitridation is carried out so that a rate of nitrogen atom coupled in the first zirconium-rich zirconium silicon oxide layer is 5% to 40%.

13. The method of claim 9, wherein the first nitridation is carried out by plasma nitridation, by a rapid thermal process in an $N_2$ atmosphere, or an $NH_3$ atmosphere, or by supplying an $N_2$ gas or an $NH_3$ gas into a furnace.

14. The method of claim 9, wherein the first silicon-rich zirconium silicon oxide layer is formed to a thickness below 80 Å.

15. The method of claim 9, wherein the second nitridation is carried out so that a rate of nitrogen atom coupled in the silicon-rich hafnium silicon oxide layer is 5% to 40%.

16. The method of claim 9, wherein the second nitridation is carried out by plasma nitridation, by a rapid thermal process in an $N_2$ atmosphere or an $NH_3$ atmosphere, or by supplying an $N_2$ gas or an $NH_3$ gas into a furnace.

* * * * *